United States Patent
Miller et al.

(10) Patent No.: US 6,847,882 B2
(45) Date of Patent: Jan. 25, 2005

(54) MISFIRE DETECTION SYSTEM AND METHOD OF MEDIAN FILTERING

(75) Inventors: Gary P. Miller, Canton, MI (US); Ray Cavell, Brighton, MI (US); Bob Gruszczynski, Belleville, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 0 days.

(21) Appl. No.: 10/438,640

(22) Filed: May 15, 2003

(65) Prior Publication Data

US 2004/0230367 A1 Nov. 18, 2004

(51) Int. Cl.$^7$ .............................................. G06F 19/00
(52) U.S. Cl. ..................... 701/111; 701/110; 701/115; 123/406.24; 123/406.33; 123/406.6; 123/406.64; 73/116; 73/117.3; 73/118.1
(58) Field of Search ................................ 701/111, 110, 701/115; 123/406.26, 406.33, 406.6, 406.64, 406.65, 406.24; 73/116, 117.3, 118.1

(56) References Cited

U.S. PATENT DOCUMENTS

| | | | |
|---|---|---|---|
| 5,109,695 A | 5/1992 | James et al. ................ 73/117.3 |
| 5,144,568 A | 9/1992 | Glover .................. 364/715.01 |
| 5,237,862 A | 8/1993 | Mangrulkar et al. .......... 73/116 |
| 5,515,720 A | 5/1996 | Remboski, Jr. et al. ........ 73/116 |
| 5,528,931 A | * 6/1996 | James et al. ................ 73/117.3 |
| 5,542,291 A | 8/1996 | James ........................ 73/117.3 |
| 5,610,328 A | * 3/1997 | Magan et al. ............... 73/117.3 |
| 5,699,253 A | 12/1997 | Puskorius et al. ..... 364/431.08 |
| 5,708,595 A | 1/1998 | Connell .................. 364/715.01 |
| 5,841,025 A | * 11/1998 | Remboski et al. .......... 73/117.3 |
| 5,862,506 A | 1/1999 | Lynch et al. ................. 701/111 |
| 5,906,652 A | * 5/1999 | Remboski et al. .......... 701/110 |
| 6,018,750 A | 1/2000 | Connell et al. ............. 708/202 |
| 6,070,567 A | * 6/2000 | Kakizaki et al. ........ 123/406.25 |
| 6,112,149 A | * 8/2000 | Varady et al. ............... 701/111 |
| 6,115,727 A | 9/2000 | Schooler et al. ...... 364/715.013 |
| 6,178,414 B1 | 1/2001 | Beckmann et al. ............ 703/3 |
| 6,388,444 B1 | * 5/2002 | Hahn et al. .................. 324/378 |
| 2002/0063208 A1 | 5/2002 | Hastings ..................... 250/281 |

FOREIGN PATENT DOCUMENTS

| | | |
|---|---|---|
| EP | 0 858 158 A3 | 5/2000 |
| WO | 0 818 887 A3 | 10/1998 |
| WO | WO 97/06483 | 2/1999 |
| WO | WO 99/23547 | 5/1999 |

OTHER PUBLICATIONS

P. Ekstrom, Embedded Systems Programming: Better Than Average, Nov. 2000 (10 pages).

* cited by examiner

*Primary Examiner*—Willis R. Wolfe
*Assistant Examiner*—Johnny H. Hoang
(74) *Attorney, Agent, or Firm*—Dickinson Wright PLLC

(57) ABSTRACT

A processor having an embedded median filter routine, a method of median filtering using a vehicle's CPU, and a misfire detection system for an internal combustion engine with crankshaft acceleration detection means for determining crankshaft acceleration values. In general, the processor is configured to receive new acceleration values and includes a data structure with a data array containing a predetermined number of data fields storing acceleration values in magnitude order. The embedded median filtering routine is configured to identify an oldest in time acceleration value, identify a deletion position in the data array for the oldest in time acceleration value, identify an insertion position in the data array, move selected acceleration values in the data array to vacate the insertion position, insert the new acceleration value in the insertion position, and determine the median value of the acceleration values in the data array.

20 Claims, 3 Drawing Sheets

MISFIRE DETECTION SYSTEM AND METHOD OF MEDIAN FILTERING

BACKGROUND OF THE INVENTION

1. Technical Field

The present invention is generally directed to a median filter and, more particularly, to a filter and median filtering method that is suitable for use in high data rate systems such as detecting misfire of internal combustion engines.

2. Description

Numerous types of median filters are known in the art and used in a variety of applications to identify instantaneous deviations from historical norms. In the context of misfire detection systems, median filters filter out unwanted signal patterns from the crankshaft accelerations. A variety of factors other than cylinder firing impact crankshaft acceleration. For example, the crankshaft undergoes periodic characteristic angular accelerations due to mass imbalances, reciprocating masses, torsional vibrations and shaft flex caused by normal engine dynamics. A median filter isolates these and other engine transient effects by subtracting a median acceleration over a series of surrounding cylinder firings from the acceleration calculated for the particular firing interval of interest. By filtering out these characteristic accelerations, median filters remove the longer term acceleration effects and provide the misfire detection system with an increased signal-to-noise ratio of the characteristic firing event acceleration so as to enhance detection of any misfire event.

During normal engine operation, the engine crankshaft experiences a characteristic acceleration as a result of each cylinder firing event. Conventional misfire detection systems continuously monitor the angular acceleration of the crankshaft to detect misfire events. A toothed wheel is fixed to rotate with the crankshaft. A sensor tracks the passing of the wheel and communicates with a clock.

A misfire event occurs when the air/fuel vapor fails to ignite and combust in the cylinder. Misfire events may result in unburned fuel being pumped into the exhaust system causing increased pollution, damage to the catalyst, and degradation of engine performance. As the demands on vehicle control systems increase, so does the need to reduce the computational demands of the misfire detection system without unduly sacrificing reliability or response time.

The suitability of a particular type median filter depends, in part, on the data rate at which the system receives new data entries, the desired response time of the system, and the computational robustness of the system. Software implemented misfire detection systems are commonly used for low data rate (LDR) systems which monitor cylinder firing events. As used herein, LDR means that there is one or at most two time period samples per cylinder firing event from which an acceleration value will be calculated. For example, in a four cylinder engine where the system tracks the passing of every ninth tooth on the crankshaft wheel, a linked list approach has historically been used to maintain a magnitude sorted list of the measured acceleration values for median determination. In general, a linked list maintains a set of data items and pointers for each data item. The pointers point to the date entries that are previous and next in magnitude. For a list of N values, a linked list approach may require as many as N software looping comparisons to find the deletion position for the oldest measured value and an additional N software looping comparisons to identify the insertion position of the new measured value in the magnitude ordered list. This conventional technique is costly in terms of processor clock cycles. For example, a conventional linked list algorithm approach for median filtering takes about 600 clock cycles to sort a list of 39 elements. Thus, the suitability of a linked list median filtering decreases as the computational intensity of the system increases. Accordingly, the use of software implemented misfire detection systems with linked list median filtering has been limited to LDR applications.

In high data rate (HDR) systems, multiple time period samples per cylinder are used to determine the acceleration associated with a cylinder's firing event. When using a 36-1 toothed wheel and measuring every other tooth, a six cylinder engine would have 6 time period samples per cylinder firing event and an eight cylinder engine would alternately have 4 or 5 time period samples per cylinder firing event. The use of multiple time period samples per cylinder firing event greatly increases the computational intensity of HDR systems and have led those in the art to resort to a hardware implementation. In such systems, a BSPA (Bus-Based Signal Processing ASIC) receives sensor input from the toothed wheel (e.g., a 36-1 tooth wheel) on the crankshaft and performs calculations before outputting median acceleration values to the main CPU. More particularly, the BSPA receives an analog CPS signal from the crankshaft sensor, digitizes and captures the period of this signal, and multiplies the signal by a correction factor to account for manufacturing imperfections in the 36-1 tooth wheel. The corrected delta times provide degrees of rotation of the crankshaft and are inverted and scaled by the BSPA to provide angular velocity. The BSPA then filters out torsional vibrations using a low pass filter, processes the filtered velocity to convert it to scaled acceleration, and then high pass filters the scaled acceleration using a median filter to remove low frequency accelerations caused by normal engine dynamics. The BSPA then further filters the acceleration using pattern cancellation to remove signals due to crankshaft twist and cylinder imbalance as well as any repeating misfire signals so the accelerations both before and after the pattern cancellation provide detection of repetitive and intermittent misfire events. The BSPA also performs a windowed peak detection process on the accelerations to reduce the values to the smallest, that is, the most negative acceleration value detected within a window of samples taken near each cylinder event.

SUMMARY OF THE INVENTION

The use of software implemented median filtering for LDR and hardware implemented median filtering for HDR has become an accepted practice in the art for a number of reasons, some of which are described above. Conventional attempts to improve the chronometrics of HDR misfire detection systems have been limited by these assumptions.

In view of the above, the present invention is directed to a processor having an embedded median filter routine, a method of median filtering using a vehicle's CPU, and a misfire detection system for an internal combustion engine with crankshaft acceleration detection means for determining crankshaft acceleration values. In general, the processor is configured to receive misfire time periods and includes a data structure with a data array containing a predetermined number of data fields storing acceleration values in magnitude order. The embedded median filtering routine is configured to identify an oldest in time acceleration value, identify a deletion position in the data array for the oldest in time acceleration value, identify an insertion position in the data array, move selected acceleration values in the data array to fill the deletion position and vacate the insertion position, insert the new acceleration value in the insertion position, and determine the median value of the acceleration values in the data array.

BRIEF DESCRIPTION OF THE DRAWINGS

The present invention will become more fully understood from the detailed description given here below, the appended claims, and the accompanying drawings in which:

DETAILED DESCRIPTION OF THE PREFERRED EMBODIMENT

Figure 1:
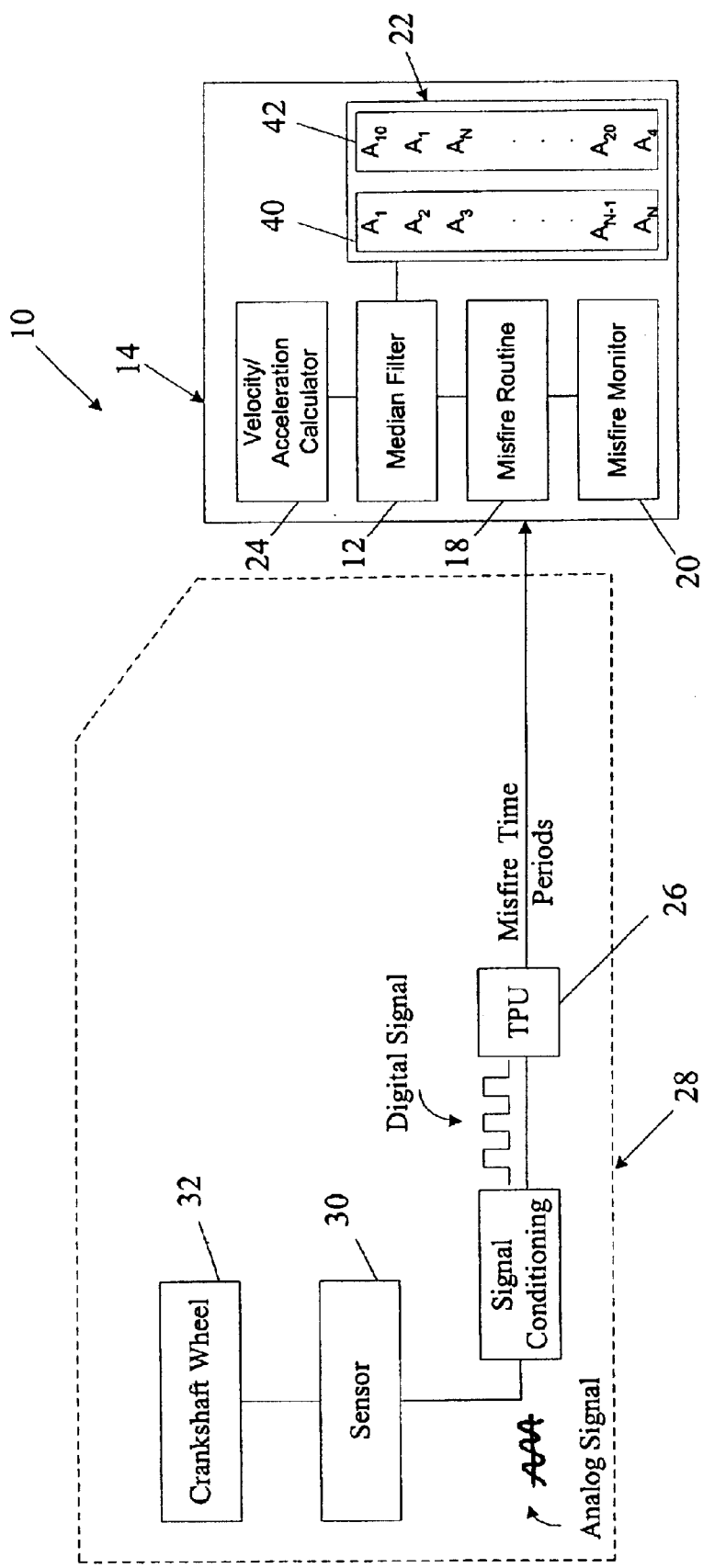
FIG. 1 is a schematic illustration of the crankshaft position detection system having a processor with a median filtering routing according to the present invention.

A misfire detection system 10 having a median filter routine 12 embedded in the vehicle's main central processing unit (CPU) 14 is generally illustrated in FIG. 1. The CPU 14 can be of any suitable configuration with processing and storage capabilities to support operation of the median filter routine described herein. While not specifically illustrated or described herein, it is contemplated that the CPU will also perform many of the control and storage functions commonly associated with conventional vehicle CPUs including spark control, fuel control, and engine diagnostics. As to the median filter capabilities, the CPU 14 receives misfire time periods, calculates acceleration values such as via a conventional velocity/acceleration calculator 24, and, using the median filter routine 12, outputs median acceleration value from a list of N values sorted by magnitude. The CPU is also shown to include a misfire routine 18 which tallies occurrence of misfires, a misfire monitor 20 which determines the type of misfire (e.g., type A or type B), and a data structure 22.

As is generally discussed above, the present invention provides a misfire detection system and a median filter routine embedded in the CPU so as to improve the speed and efficiency of the system as well cost savings relative to conventional approaches. The present invention recognizes that the median filter is a bottleneck in misfire detection chronometrics and departs from conventional approaches by using a software implemented median filter routine that maintains a magnitude sorted list of acceleration values and moves the acceleration values stored in the list when a new value is obtained. Further, the invention maintains the magnitude sorted array without using a linked list approach. As opposed to a linked list approach which requires as many as 600 clock cycles to sort a list of 39 elements, the median filter routine of the present invention requires only about 200 clock cycles for the same list. The advantages of the present invention further include cost savings associated with moving misfire functionality from the BSPA to the CPU. Moreover, the present invention provides a misfire detection system that may be used for both LDR and HDR applications.

In the illustrated embodiment, the misfire time periods are provided to the CPU in a conventional manner, such as by a conventional crankshaft position detection assembly 28. While those skilled in the art will appreciate that a variety of mechanisms for accurately recording the time periods may be used with the invention, in the illustrated embodiment the controller 14 receives misfire periods from a conventional Time Processing Unit (TPU) 26. The TPU determines the misfire periods from a conventional position or angular detection sensor 30 monitoring a toothed crankshaft wheel 32 (such as a 36-1 tooth wheel). The velocity/acceleration calculator 24 receives the misfire time periods and, from the time value and the known spacing between the teeth on the crankshaft wheel 32, calculates velocities and accelerations using conventional techniques such as profile correction to compensate for manufacturing irregularities. It should be appreciated that while the CPU 14 is illustrated and described herein as including an embedded velocity/acceleration calculator 24 in order to determine acceleration values based upon the misfire time periods provided by the CPU, the misfire detection system 10 of the present invention may be configured to determine the acceleration values separate from the CPU 14 and feed such values to the CPU for further processing as described herein. Further, the crankshaft position detection assembly 28 and the velocity/acceleration calculator 24 of the CPU 14 provide a crankshaft acceleration detection means that determines crankshaft acceleration values and communicates these values to the other modules of the processor. Those skilled in the art will appreciate that other mechanisms may be used to determine these crankshaft acceleration values including the above described embodiments as well as those described in the background of this application.

Figure 2:
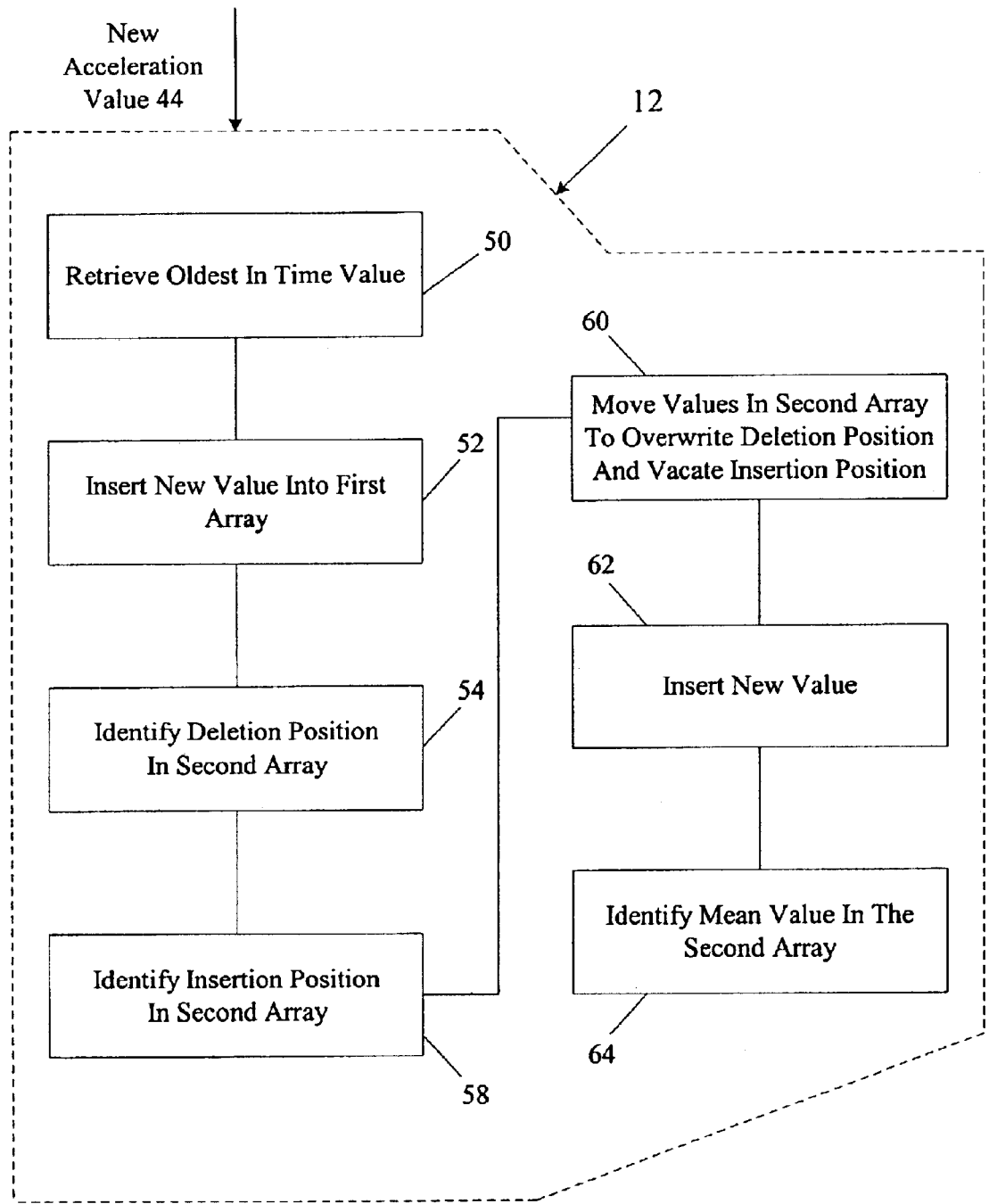
FIG. 2 is a flow chart for the median filtering routine.

The details of the CPU 14 relating to the operation of the median filter routine 12 are more clearly illustrated in FIGS. 1 and 2. The CPU data structure 22 includes first and second data arrays 40 and 42 accessible by the median filter routine 12. The first data array includes a chronological list of acceleration values received by the CPU. The second data array 42 contains the same acceleration values in a magnitude sorted listing. As is shown in FIG. 2, when the CPU receives a new acceleration value 44, the median filter routine 12 is configured to retrieve the oldest in time acceleration value from the first data array (Step 50), insert the new acceleration value in the newest in time field in the first data array (Step 52), identify a deletion position in the second data array for the retrieved acceleration value (Step 54), identify the insertion position of the new acceleration value in the second data array based on its magnitude relative to the remaining values in the second data array (Step 58), move the acceleration values in the second data array located between the insertion position and deletion position to fill the deletion position and vacate the insertion position (Step 60), insert the new acceleration value in the now vacant insertion position (Step 62), and identify the mean value in the second data array (Step 64).

Figure 3:
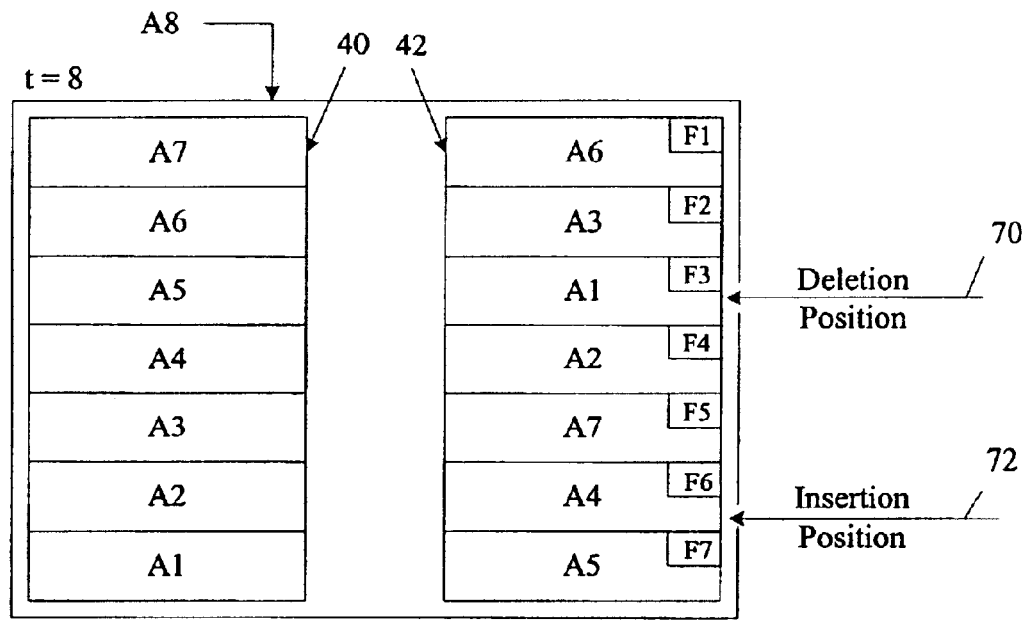
FIG. 3 illustrates exemplary data arrays for the median filter at a first time.
Figure 4:
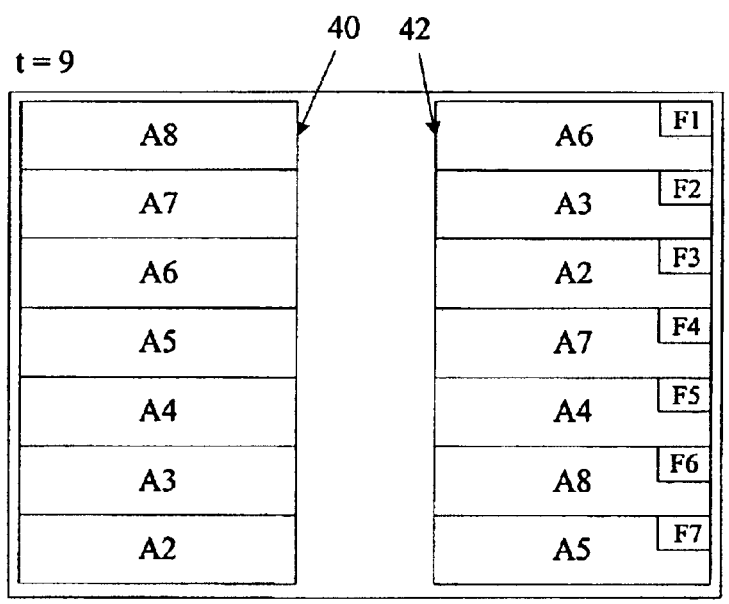
FIG. 4 illustrates exemplary data arrays for the median filter at a second time.

For clarity of explanation, the process generally recited above and illustrated in FIG. 2 will now be described with reference to the example shown in FIGS. 3 and 4. In this example, the first data array 40 contains seven chronologically listed acceleration values and the second data array 42 contains the same seven acceleration values sorted by magnitude. FIG. 3 shows the exemplary data arrays at time t=8 (that is, when the CPU and median filter routine receives the eighth acceleration value A8) and FIG. 4 shows the exemplary data arrays at time t=9. Upon receipt of the new acceleration value, A8, the median filter routine 12 retrieves the oldest acceleration value, A1, from the first data array (Step 50) and inserts the new acceleration value, A8, into the first data array (Step 52, see FIG. 4). In the illustrated embodiment, a circular first-in-first-out (FIFO) buffer is used to implement the chronological list of the first data array. Notwithstanding this illustration of the first data array, including the acceleration values in a chronological list from top to bottom, the median filter routine may use any number of conventional storage and retrieval techniques to identify the chronological order of the received acceleration values.

In Step 54, the median filter routine 12 identifies a deletion position 70 in the second data array for the retrieved acceleration value, that is, the position of the oldest value, A1, in the second data array 42. The median filter routine also identifies an insertion position 72 for the new acceleration value, A8, in the second data array based on the magnitude of the new acceleration value relative to the values in the second data array (Step 58). In this example, the magnitude of the new acceleration value, A8, is greater than the acceleration value A4 and less than the acceleration value A5. Therefore, the median filter identifies the sixth field, F6, in the second data array as the insertion position. After identifying the insertion position, the median filter routine moves those acceleration values located between the insertion position 72 and deletion position 70 (i.e., values A2, A7, and A4) to overwrite the deletion position and vacate the insertion position (Step 60). That is, value A2 is moved from field F4 to F3, value A7 from F5 to F4, and value A4 from F6 to F5, thereby overwriting value Al in the deletion position F3 and vacating the insertion position F6. In the preferred embodiment, the median filter simultaneously moves at least two of the selected values in order to further enhance its operating efficiency. The median filter routine then inserts the new acceleration value, A8, in the now vacant insertion position F6 (Step 62) and identifies the mean value in the second data array (Step 64). In the illustrated example, the median acceleration value is simply retrieved from the appropriate median field, ie., value A7 from median field F4 of the second data array.

In order to further enhance the computational efficiency of the median filter routine 12 in the context of a CPU implemented misfire detection system, the median filter routine is configured to identify the deletion position (Step 54) and the insertion position (Step 58) through binary searching. Thus, the median filter routine 12 divides the list of N values in the magnitude sorted second data array 42 in half, compares the new value, e.g., A8, to the highest value in the lower valued half, e.g., A1, or the lowest value in the higher valued half, e.g., A7, and then repeats until the insertion or deletion position is identified. Notwithstanding the preference for binary searching, those skilled in the art should appreciate that other search techniques may be used. For example, the search may be performed by starting at a given point in the list, preferably the beginning or end, and comparing the magnitude of the new acceleration value to each value in the second data array to find the insertion and deletion positions.

As is described above, the median filter routine of the present invention provides a CPU implemented median filter routine that improves the efficiency and speed of the system so as to address the previous unaddressed chronometric bottleneck of conventional median filtering approaches. The present invention recognizes that the median filter is commonly a bottleneck in misfire detection chronometrics and departs from conventional median filtering approaches in HDR applications by using a software implemented median filter routine that maintains a magnitude sorted list of acceleration values and moves the acceleration values stored in the list when a new value is obtained. Further, the invention maintains the magnitude sorted array without using a linked list approach. The present invention provides a fast and efficient software implemented median filtering routine with a number of advantages over conventional systems including cost savings associated with moving misfire functionality from the BSPA to the main CPU. Moreover, the present invention provides a misfire detection system that may be used for both LDR and HDR applications.

Numerous modifications may be made to the above described exemplary embodiment. By way of example rather than limitation, the above discussion should not be interpreted to require a specific sequence of operations. For example, the identification of the deletion position in the second data array (Step 54) may occur before or after the identification of the insertion position (Step 58) and the insertion of the new acceleration value in the first data array (Step 52) may occur at any time prior to receipt of the next value. Further, while the data arrays are shown in FIGS. 3 and 4 to contain only seven acceleration values, the size of the arrays may vary as needed. Additionally, in the above description, the median determination is obtained in Step 64 by simply taking the acceleration from the median field of an odd number of magnitude ordered acceleration values. Those skilled in the art will appreciate that in an array with an even number of fields, the average of two acceleration values may be used to determine the median. Still further, while the median filter routine of the present invention is particularly suited for high data rate applications, an additional benefit of the routine is its suitability for low data rate applications thereby eliminating the need for different misfire detection techniques based on data rates.

Those skilled in the art will appreciate that a variety of alternative system components, including alternative configurations for determining the crankshaft acceleration as well as filtering or scaling measured data, may be used without departing from the scope of the invention defined by the appended claims. Moreover, the median acceleration values provided by the embedded median filter routine 12 may be used by the system 12 and/or CPU 14 in any conventional manner. For example, the acceleration value may be processed further using pattern cancellation and windowed peak detection in the manner described above. Further, the median acceleration values from the median filter routine 12 may be used to determine a Median Filter Value (a non-pattern cancelled acceleration value) by subtracting the median acceleration value determined from the second data array in Step 64 from a median value of the first data array. The Median Filter Value may then be communicated to the misfire monitor 20 (FIG. 1). Conventional misfire monitors use Median Filter Values to determine hard misfires (e.g., repeated misfiring of a single cylinder) and commonly receive a pattern cancelled acceleration value to determine random misfiring occurrences above a threshold.

The foregoing discussion discloses and describes an exemplary embodiment of the present invention. One skilled in the art will readily recognize from such discussion, and from the accompanying drawings and claims that various changes, modifications and variations can be made therein without departing from the true spirit and fair scope of the invention as defined by the following claims.

What is claimed is:

1. A misfire detection system for an internal combustion engine having a crankshaft, said system comprising:

crankshaft acceleration detection means for determining crankshaft acceleration values;

a processor communicating with said crankshaft acceleration detection means to receive a new acceleration value, said processor having a data structure with a data array containing a predetermined number of data fields storing acceleration values in magnitude order, said processor having an embedded median filtering routine configured to identify an oldest in time acceleration value,
identify a deletion position in the data array for the oldest in time acceleration value,
identify an insertion position in the data array,
move selected acceleration values in the data array to vacate the insertion position,
insert the new acceleration value in the insertion position, and
determine the median value of the acceleration values in the data array.

2. The misfire detection system of claim 1 wherein said processor further includes a misfire routine and a misfire monitor.

3. The misfire detection system of claim 1 wherein said data structure includes first and second data arrays, said second data array comprising said data array containing the predetermined number of data fields storing the acceleration values in magnitude order, said first data array containing the same predetermined number of data fields and storing the acceleration values in chronological order, and wherein said median filtering routine identifies the deletion position for the oldest in time acceleration value in the second data array by retrieving the oldest in time acceleration value from the first data array.

4. The misfire detection system of claim 3 wherein the processor identifies the deletion position for the oldest in time acceleration value in the second data array by performing a binary search of the data entries in the second data array.

5. The misfire detection system of claim 1 wherein said median filter routine simultaneously moves two of the selected acceleration values.

6. The misfire detection system of claim 1 wherein said processor receives new acceleration values from said crankshaft acceleration detection means at a high data rate.

7. The misfire detection system of claim 1 wherein the selected acceleration values include the acceleration value in the insertion position and all acceleration values between the insertion position and the deletion position.

8. A processor having an embedded median filter routine configured to determine the median acceleration value of a crankshaft in an internal combustion engine, said processor comprising:

a data structure with a first data array chronologically listing a plurality of crankshaft acceleration values and a second data array containing a list of said plurality of crankshaft acceleration values sorted by acceleration value magnitude;

a median filter routine embedded on said processor, said median filter routine communicating with said first and second data arrays and configured to receive new acceleration values and, upon receipt of each new acceleration value, to retrieve the oldest in time acceleration value from the first data array,
identify a deletion position in the second data array for the oldest in time acceleration value,
identify an insertion position for the new acceleration value in the second data array,
move selected acceleration values in the second data array to vacate the insertion position,
insert the new acceleration value in the insertion position, and
determine the median value of the acceleration values in the second data array.

9. The misfire detection system of claim 8 wherein the median filter routine identifies the deletion position in the second data array for the oldest in time acceleration value by performing a binary search of the data entries in the second data array.

10. The misfire detection system of claim 8 wherein said median filter routine simultaneously moves two of the selected acceleration values.

11. The misfire detection system of claim 8 wherein said median filter routine receives new acceleration values at a high data rate.

12. The misfire detection system of claim 8 wherein said median filter routine receives new acceleration values at a low data rate.

13. A method of median filtering using a processor communicating with a data array containing a predetermined number of data fields storing data entries in magnitude order, said method comprising:

receiving a new data entry;
identifying an oldest in time data entry in the data array and a deletion position data field for the oldest in time data entry;
identifying an insertion position data field for the new data entry in the data array;
moving selected data entries in the data array to vacate the insertion position;
inserting the new data entry in the insertion position; and
identifying the median value of the data entries in the data array.

14. The method of claim 13 wherein the step of determining the insertion position for the new data entry in the data array includes performing a binary search of the data entries in the data array.

15. The method of claim 13 wherein the processor includes first and second data arrays, said second data array comprising said data array containing the predetermined number of data fields storing the data entries in magnitude order, said first data array containing the same predetermined number of data fields and storing the data entries in chronological order, and wherein the step of identifying a deletion position for the oldest in time data entry in the second data array includes retrieving the oldest in time data entry from the first data array.

16. The method of claim 15 wherein the step of identifying a deletion position for the oldest in time data entry in the second data array further includes performing a binary search of the data entries in the second data array.

17. The method of claim 13 wherein the step of moving the data entries includes simultaneously moving two data entries at a time.

18. The method of claim 13 wherein said processor receives new data entries at a high data rate.

19. The method of claim 13 wherein said processor receives new data entries at a low data rate.

20. The method of claim 13 further including calculating a median filter value by subtracting the identified median value of the data entries in the data array from a median value of a chronological listing of the acceleration values, and outputting the median filter value to a misfire monitor.

\* \* \* \* \*

UNITED STATES PATENT AND TRADEMARK OFFICE
CERTIFICATE OF CORRECTION

PATENT NO. : 6,847,882 B2
DATED : January 25, 2005
INVENTOR(S) : Gary P. Miller et al.

It is certified that error appears in the above-identified patent and that said Letters Patent is hereby corrected as shown below:

Title page,
Item [56], References Cited, FOREIGN PATENT DOCUMENTS,
"WO 0 818 887 A3 10/1998" should be -- EP 0 818 887 A3 10/1998 -- and
"WO 97/06483 2/1999" should be -- WO 97/06483 2/1997 --.

Signed and Sealed this

Nineteenth Day of April, 2005

JON W. DUDAS
*Director of the United States Patent and Trademark Office*